United States Patent [19]

Nagata et al.

[11] Patent Number: 4,996,438

[45] Date of Patent: Feb. 26, 1991

[54] LINE IMAGE SENSOR WITH CONTROLLED PHOTOSENSITIVITY

[75] Inventors: Tatsuya Nagata, Niihari; Michihiro Watanabe, Tsuchiura; Eiichi Hara; Takehiko Yamada, both of Chigasaki, all of Japan

[73] Assignee: Hitachi, Ltd., Tokyo, Japan

[21] Appl. No.: 393,955

[22] Filed: Aug. 15, 1989

[30] Foreign Application Priority Data

Aug. 24, 1988 [JP] Japan .................. 63-208391

[51] Int. Cl.⁵ .............................. H01J 40/14
[52] U.S. Cl. ................. 250/211 R; 250/208.1
[58] Field of Search ............. 250/208.1, 211 R, 211 J; 357/30 H, 30 Q, 30 R, 30 K; 358/213.15, 213.31

[56] References Cited

U.S. PATENT DOCUMENTS 4,659,984  3/1987  Furushima et al. ............. 250/211 R
4,887,166 12/1989  Kakinuma et al. ............. 250/211 R
4,916,306  4/1990  Heidtmann et al. ................. 357/30

FOREIGN PATENT DOCUMENTS 58-63164  4/1983  Japan .

OTHER PUBLICATIONS

Nishiguchi et al., "Where Are We Now With Amorphous Silicon Devices", May 1985, pp. 53-56.

Primary Examiner—David C. Nelms
Assistant Examiner—K. Shami
Attorney, Agent, or Firm—Antonelli, Terry, Stout & Kraus

[57] ABSTRACT

A photoelectric transfer element of which a reading sensor for reading written materials such as facsimile documents has a controlled photosensitive region within the photoelectric transfer element. Thus photosensitivity in a region of the photoelectric transfer element is reduced to improve element performance. The specific photosensitivity control methods include an electric field control, increased impurity concentration, and irradiation ultraviolet light.

4 Claims, 4 Drawing Sheets

F I G. 1
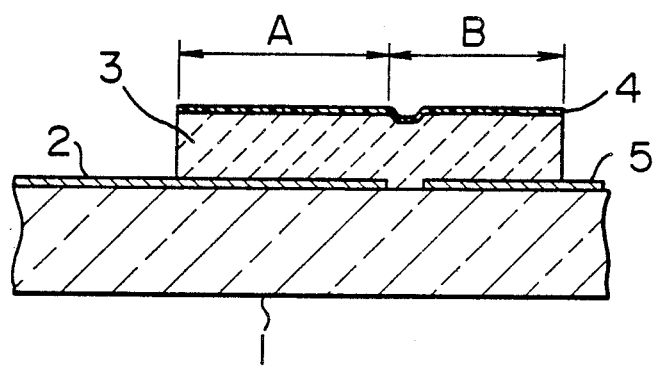
F I G. 2
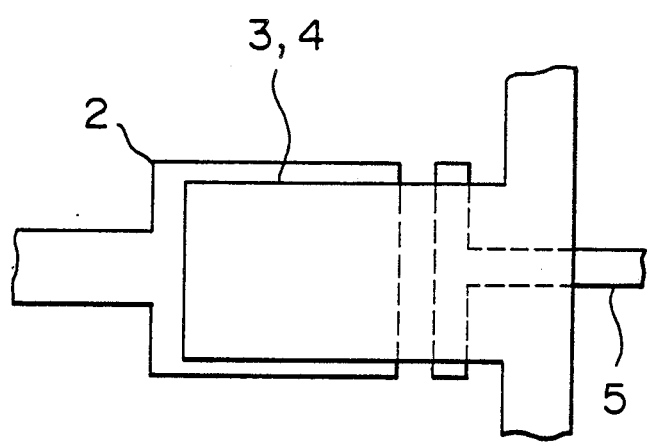
F I G. 3
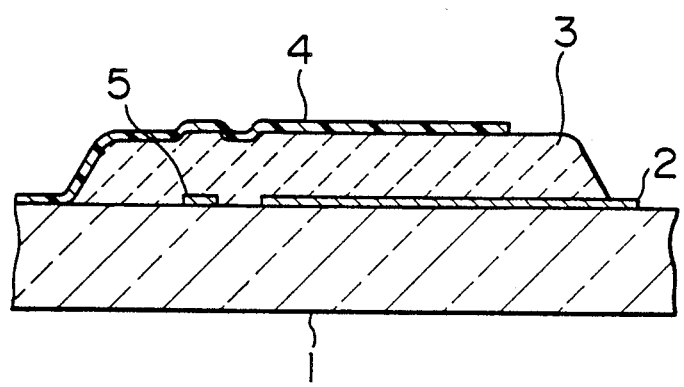

F I G. 10
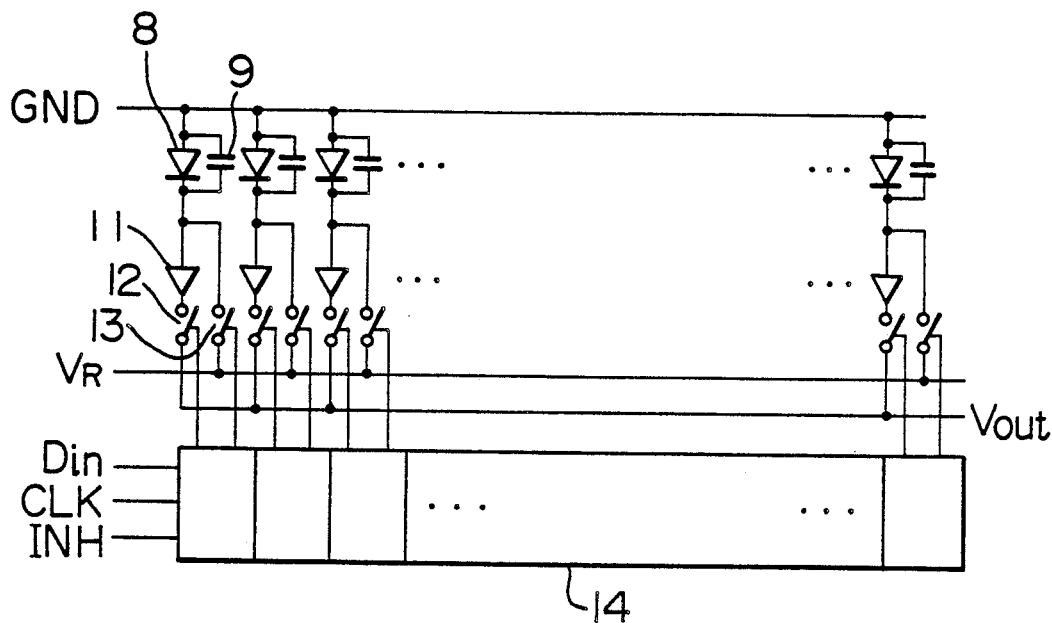
F I G. 11
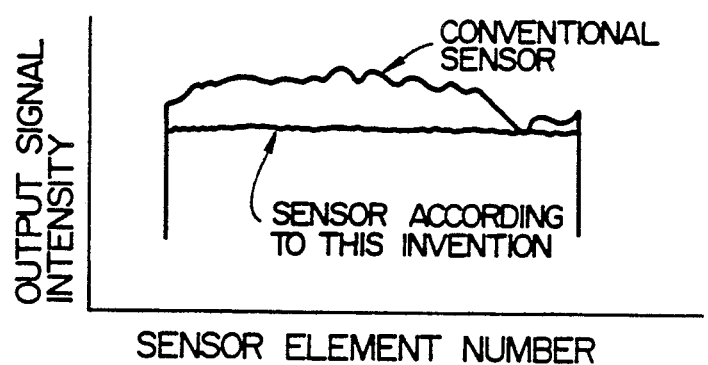

LINE IMAGE SENSOR WITH CONTROLLED PHOTOSENSITIVITY

BACKGROUND OF THE INVENTION

1. Field of the Invention

This invention relates to line image sensors to be used for reading written materials such as facsimile documents, and to element structures which control photosensitivities of photoelectric transfer elements of which the line image sensors consist either on an inter-element basis or on an element basis.

2. Description of the Related Art

Conventional photoelectric transfer elements are, as disclosed in Japanese Patent Unexamined Publication No. 58-63164. They are of such sandwiched type with a photoconductive film is interposed between a top transparent electrode and a bottom metal electrode. On the other hand, photoelectric transfer elements which receive light along the side of the bottom electrode are discussed in pages 53 to 56 in the proceedings of the Electronic Photography Society Symposium "Where Are We Now with Amorphous Silicon Devices" published in May 1985.

Conventional photoelectric transfer elements are of the so-called sandwiched type in which a photoconductive film is interposed between a bottom electrode and a top transparent electrode. Both electrodes sandwiching the photoconductive film are so arranged that the photoconductive film protrudes out from the bottom electrode in order to prevent both electrodes from being short-circuited by the photoconductive film. For this reason, when performing a so-called direct contact type reading in which written material is irradiated through a substrate by a light source provided at the rear side of the substrate with reflected light received. The light from the light source directly irradiates the photoconductive film which protrudes from the bottom electrode. Thus a photoelectric current is generated, and such photoelectric current becomes noise against photoelectric current generated by the light reflected from the written material irradiating the photoconductive film, thereby causing the reading quality to be impaired, and this has long been a problem. Furthermore, in conventional photoelectric transfer elements, since the photoconductive film continuously covers a plurality of photoelectric transfer elements, a problem has existed in that they are susceptible to so-called "cross talk," or output current variations caused by voltages of neighboring photoelectric transfer elements and the amounts of the irradiated light.

SUMMARY OF THE INVENTION

The object of the present invention is to provide a photoelectric transfer element and a line image sensor capable of controlling photosensitivities of the photoelectric transfer elements either on an interelement basis or on an element basis and thus capable of making a high quality reading with minimum noise.

To achieve this object, an electric field control electrode is provided in the photoelectric transfer element according to the present invention, in addition to the bottom and top electrodes.

According to this constitution, when a light beam irradiates the photoconductive film interposed between the top and bottom electrodes, electrons and holes are generated, which then become a photoelectric current directed by an electric field applied to the top and bottom electrodes from an external source. When the electric field control electrode is arranged in the protruding portion of the photoconductive film, which is a region not desirable in terms of signal processing, and its potential is caused to be close to that of a signal detecting electrode, carriers generated in the protruding portion are trapped by the electric field control electrode and do not flow into the signal detecting electrode. As a result, no photoelectric current, which has been generated at the photoconductive film protruded from the electrode and which will thus become noise, is present in the signal, whereby an signal-to-noise ratio improves.

In this case, if the electric field control electrode could be prepared in the same process as the bottom and top electrodes, no special preparation process for the electric field control electrode would be required, thus allowing high performance photoelectric transfer elements to be fabricated inexpensively.

Furthermore, in order to achieve the above object, the photoelectric transfer element according to this invention is characterized in that the photosensitivity of the photoelectric transfer element having a photoconductive film made up of hydrogenated amorphous silicon is controlled by irradiating an ultraviolet light at a predetermined part of the photoconductive film.

According to this constitution, for a region where the presence of the photosensitivity of the photoelectric transfer element having a photoconductive film made up of hydrogenated amorphous silicon causes inconvenience, the photosensitivity is adjustable by irradiating a light whose wavelength is equal to that of ultraviolet. This is based on a property of hydrogenated amorphous silicon whose photosensitivity decreases irradiated light with.

Moreover, in order to achieve the above object, the photoelectric transfer element according to this invention is characterized in that the photosensitivity is controlled on the basis of a region in the photoconductive film having an increase in the impurity concentration.

According to this constitution, the photosensitivity can be changed by changing the impurity concentration within the photoconductive film. When the impurity concentration is increased, carriers generated in the photoconductive film by irradiation of light increases the rate of recombination whereby the current to be detected as a photoelectric current by reaching the top and bottom electrodes becomes small.

By linearly disposing the above-mentioned photoelectric transfer element, a line image sensor can be constructed.

The present invention provides a line image sensor characterized in that by irradiating ultraviolet light on photoelectric transfer elements made up of hydrogenated amorphous silicon, the photosensitivity of each photoelectric transfer elements is controllable. In other words, the line image sensor, proposed by this invention, comprises a plurality of linearly disposed photoelectric transfer elements made up of hydrogenated amorphous silicon, wherein the photosensitivity of the photoelectric transfer element is controlled by irradiating thereto a highly intense ultraviolet light. This proposal is based on the property of hydrogenated amorphous silicon whose photosensitivity decreases irradiation of light. This proposal also refers to controlling output variations commonly observed among a plurality of elements of which a line image sensor consist, by adjusting, on an element basis, amounts of irradiated ultraviolet.

This invention provides effects in controlling the photosensitivities of the photoelectric transfer elements either on an inter-element basis or on an element basis. Thus, it can provide a photoelectric transfer element and a line image sensor capable of making a high quality reading with minimum noise.

BRIEF DESCRIPTION OF THE DRAWINGS

FIGS. 1, 3, 5, and 7 are sectional views of embodiments according to this invention, respectively;

FIGS. 2, 4, 6, and 8 are plan views of the embodiments referred to in FIGS. 1, 3, 5, and 7, respectively;

FIG. 10 is a circuit diagram of a line image sensor according to embodiments of this invention; and FIG. 11 is a characteristic diagram showing output signal variations of the line image sensor according t the embodiments of this invention.

PREFERRED EMBODIMENTS OF THE INVENTION

Figure 4:
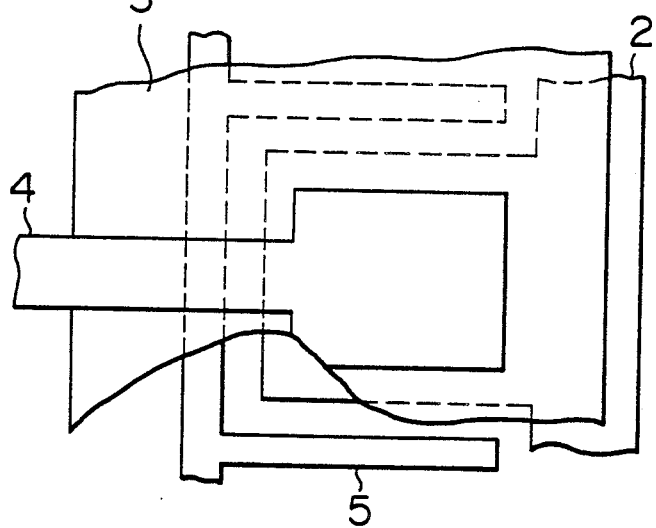

There now follows an explanation of embodiments according to this invention.

A first embodiment is explained by referring to FIGS. 1 and 2. Here, FIG. 1 is a sectional view and FIG. 2 is a plan view. A bottom electrode 2 and an electric field control electrode 5 are formed on a glass substrate 1, and a photoconductive film 3 and a top transparent electrode 4 are formed thereupon so that they overlap the bottom electrode 2 as much as possible. In this embodiment, the electrode which detects signals is the bottom electrode 2.

The glass substrate should be transparent and insulating. It is 1 mm thick in this embodiment, but its preferred thicknesses are in the range of 0.7 mm~.2 mm. A thinner substrate shows better performance, but if it is too thin, it becomes susceptible to heat-induced cracks and like defects, which then impose a handling problem. The bottom electrode 2 and the electric field control electrode 5 are chromium in this embodiment, serving also as light shielding elements. The photoconductive film 3 used in this embodiment is hydrogenated amorphous silicon, consisting of a combination of an i-layer and a p-layer forming a photodiode. This photoconductive film 3 is 1 $\mu$m thick in this embodiment. Thicknesses between 0.3 $\mu$m and 2 $\mu$m are practically applicable. The thicknesses in that range are required because too thick a film is susceptible to separation, while too thin a film does not serve to absorb the light. The top transparent electrode 4 which is stacked on the photoconductive film 3 is made up of a Cr-Si compound (chromium silicide) in this embodiment, but other materials such as In-Sn oxides are of course applicable.

By applying a voltage between the bottom electrode 2 and the top transparent electrode 4 and irradiating light beams from the sides of the glass substrate 1 and the top transparent electrode 4, a part of the light beam from the side of the glass substrate 1 is screened, while the other part thereof reaches the photoconductive film protruding from the bottom electrode 2. A light beam from the side of the top transparent electrode 4 reaches the photoconductive film 3 by transmission through the top transparent electrode 4.

The light beams that reach the photoconductive film 3 generate electrons and holes. The electrons and holes are accelerated in their movement in opposite direction by the voltage applied between the bottom electrode 2 and the top transparent electrode 4, and detected as a photoelectric current flowing between the electrodes. The light beam into the side of the glass substrate becomes a source of a noise component. Thus carrier pairs generated at a region B on the photoconductive film, shown in FIG. 1, form noise upon reaching the bottom electrode 2 from which the signal is detected, and this is not desirable. If the potential applied to the electric field control electrode 5 is brought to a level close to that of the bottom electrode 2, the majority of the carriers generated at the region B is absorbed by the electric field control electrode 5, whereby the major current is the photoelectric current generated at region A. As a result, a substantial reduction in noise can be achieved.

FIG. 1, which is merely a schematic representation, may not serve to give an idea as to correct dimensions. In actuality, the photoconductive film 3 is approximately 1 $\mu$m thick, and the distance between the bottom electrode 2 and the electric field control electrode 5 can be shortened to a range of 1-10 $\mu$m, depending on the potential difference between the two. The potential of the electric field control electrode 5 may not necessarily be equal to that of the bottom electrode 2, thus further increase in its potential difference with respect to the top transparent electrode 4 contributes to further reducing noise components. The polarities of the top transparent electrode 4 and the bottom electrode 2, which are determined by the constitution of the photoconductive film 3, may take either positive or negative. The electric field control electrode 4 becomes effective if it is given a polarity which is identical to that of the bottom electrode 2 which detects the signal with either polarity.

A second embodiment according to this invention is explained by referring to FIGS. 3 and 4. FIG. 3 is a sectional view of this embodiment and FIG. 4 is the plan view thereof. An electric field control electrode 5 and a bottom electrode 2 are formed on a glass substrate 1, and a photoconductive film 3 is formed thereupon. Further on said photoconductive film, a top transparent electrode 4 is provided. The stacking sequence is the same as in the first embodiment, but the second embodiment differs from the first in that in the second embodiment the output signal is detected by the top transparent electrode 4. The photoconductive film 3 in the second embodiment is so formed that it covers a wider region, and it is left unpatterned. Respective materials are as applied to the first embodiment.

When a light beam is injected from the side of the top transparent electrode, carriers are generated at the photoconductive film 3 and directed by voltages applied to the top transparent electrode 4, bottom electrode 2, and electric field control electrode 5. These carriers take the form of current when caused to move by electric fields and reach the electrodes. The photoconductive film 3 is formed wide so that it generates carriers over its entire surface. However, by applying to the electric field control electrode 5 the same potential as that of the top transparent electrode 4 which is the signal detecting electrode, only the carriers present in a portion surrounded by the electric field control electrode 5 can reach the top transparent electrode 4. This makes the embodiment effective in improving resolution with limited photosensitive region. This also keeps the photoelectric transfer element less susceptible to influences from voltages of surrounding photoconductive film and irradiating conditions, whereby it is effective in reducing noise such as cross talk.

Figure 5:
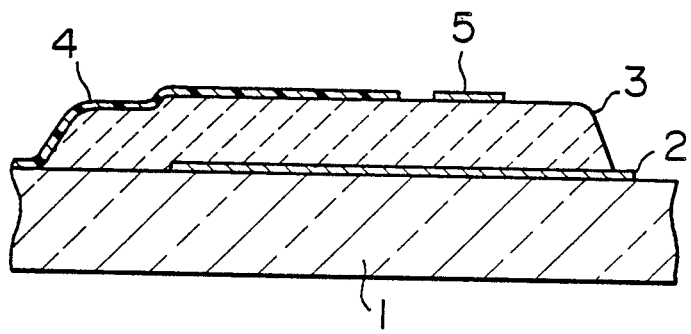
Figure 6:
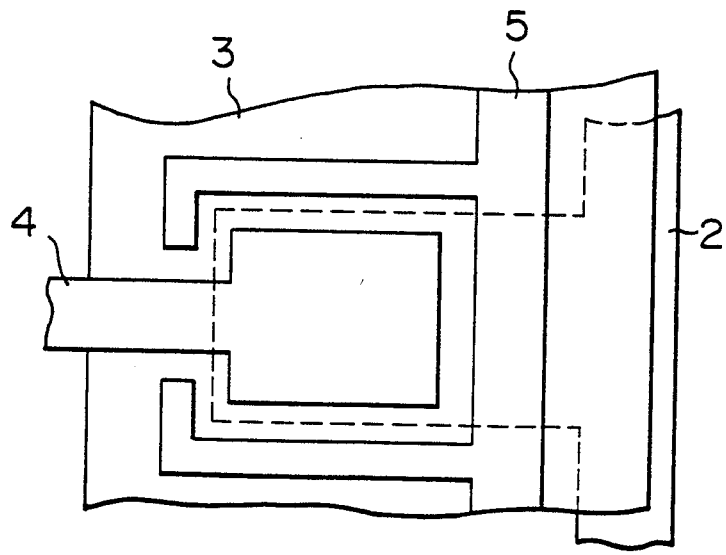

A third embodiment according to this invention is explained by referring to FIGS. 1 to 6. In the embodiments shown in FIGS. 1 to 4, the bottom electrode 2 and the electric field control electrode 5 are formed on the glass substrate 1. In this embodiment, however, these two electrodes are formed by the same patterning process such as coating or etching, whereby the electric field control electrode 5 can be formed with a conventional process, or in other words, without increasing processing steps. FIGS. 5 and 6 show the embodiment in which the electric field control electrode 5 is formed by the same patterning process as the top transparent electrode 4. FIG. 5 is a sectional view of a photoelectric transfer element and FIG. 6 is a plan view thereof. Its operation, respective materials, and their thicknesses are the same as the embodiment referred to in FIGS. 3 and 4. This third embodiment is effective in that since the electric field control electrode 5 is formed by the same process as the top transparent electrode 4, it is not necessary to increase processing steps for the formation of the electric field control electrode 5.

Figure 7:
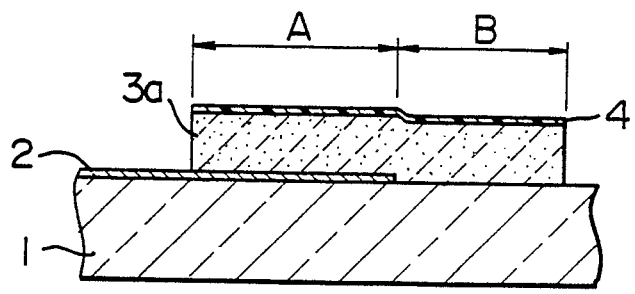
Figure 8:
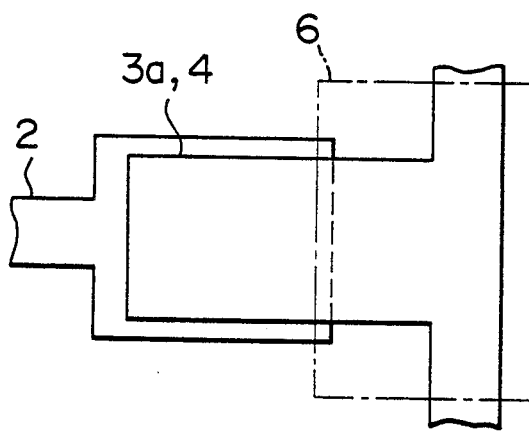

A fourth embodiment according to this invention is explained by referring to FIGS. 7 and 8. FIG. 7 is a sectional view of a photoelectric transfer element and FIG. 8 is a plan view thereof. A bottom electrode 2 is formed on a glass substrate 1, and a photoconductive film 3a made up of hydrogenated amorphous silicon and a top transparent electrode 4 are formed thereupon in this order. The photoconductive film 3a and the top transparent electrode 4 are of the same dimensions. Respective materials and their thicknesses are as applied to the first embodiment. A region 6 is the region to be irradiated.

Carriers are generated upon injection of a light beam on the photoconductive film 3a, and formed into a photoelectric current after being separated by a difference of potentials applied between the top transparent electrode 4 and the bottom electrode 2. Referring to FIG. 7, photosensitivity must be present in a region A, whereas it is preferably not present in a region B. When ultraviolet light is irradiates the region to be irradiated as referred to above in FIG. 8, the photosensitivity of the hydrogenated amorphous silicon in the irradiated region decreases. As a result, the photosensitivity of region B where the presence of a photoelectric current is not desired decreases, contributing to reducing noise. This irradiation of ultraviolet light which is effective in reducing the photosensitivity does not require any special wiring pattern, thereby providing more freedom in the design of photoelectric transfer elements.

Figure 9:
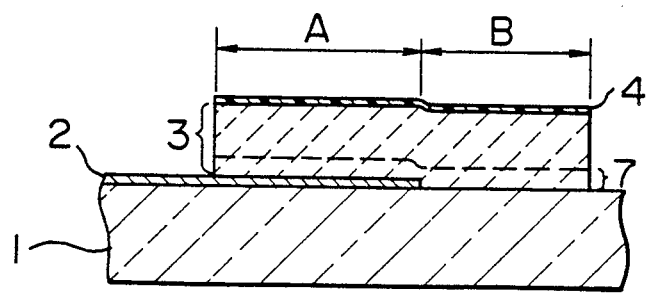
FIG. 9 is a sectional view of another embodiment according to this invention.

A fifth embodiment according to this invention is explained by referring to FIG. 9. FIG. 9 is a sectional view of a photoelectric transfer element, wherein a bottom electrode 2, a photoconductive film 3, and a top transparent electrode 4 are sequentially stacked on a glass substrate 1; a predetermined pattern is formed; and the photoconductive element 3 is interposed between the top transparent electrode 4 and the bottom electrode 2 like a sandwich. Except for a part of the photoconductive film whose impurity concentration is made higher, other factors are as applied to the first embodiment. A region 7 is the high impurity concentration region.

A certain potential difference is provided between the top transparent electrode 4 and the bottom electrode 2 in advance. Upon irradiation of a light beam on the photoconductive film carrier pairs of electrons and holes are generated, which are separated to flow in opposite directions by the electric field applied between the electrodes, whereby they are detected as a photoelectric current upon reaching the electrodes. The probability of these generated carriers reaching the electrodes depends, to a great degree, on the potential gradient, carrier mobility, and impurity concentration of recombination centers. Region A shown in FIG. 9 has a large potential gradient and high impurity concentration region 7 which is susceptible to recombination, but reduction in its photosensitivity is small. On the other hand, in region B where the potential gradient is small, the presence of a high impurity concentration region promotes recombination of the majority of the generated carriers. Thus, by partially providing high impurity concentration regions, the photosensitivities of the regions A and B are controlled so that a photoelectric transfer element with minimum noise can be provided.

If a plurality of photoelectric transfer elements according to this invention are linearly disposed to form a line image sensor, the line image sensor consists of photoelectric transfer elements with reduced noise, whereby this invention is effective in providing a line image sensor capable of making a high quality reading.

An embodiment of the line image sensor according to this invention is explained by referring to FIGS. 7, 10 and 11. FIG. 10 shows photodiode 8 having photoconductive film 3, also shown a combination of photodiode 8 and storage capacitance 9 built in the photoelectric transfer element. The line image sensor according to this invention comprises a plurality of photoelectric transfer elements linearly as well as parallelly disposed as shown in FIG. 10, where having a buffer 11; a transfer switch 12; a reset switch 13; and a shift register 14.

As shown in FIG. 7, the line image sensor is formed by linearly disposing a plurality of photoelectric transfer elements having a photoconductive film 3a made up of hydrogenated amorphous silicon. When a light beam irradiates the line image sensor, conventionally, output variations persisted among individual photoelectric transfer elements even in reading a blank material as shown in FIG. 11, which output variations are attributable to dimensional variations among photoelectric transfer elements, wiring layout, variations associated with assembling, and distribution of irradiated light beams. In the present invention, such output signal intensity variations of individual photoelectric transfer elements are suppressed by irradiating ultraviolet light on each of the photoelectric transfer elements made up of hydrogenated amorphous silicon in correspondence with their output intensities and adjusting their photosensitivities to lower levels. This allows the fixed pattern of noise contributing to impairing reading quality to be reduced, and thus makes the present invention effective in providing a high quality line image sensor. Furthermore, according to this invention, conventional line image sensors which have been considered defective because of their large output variations can improve such variations through proper adjustments, which makes this invention effective in improving their yield.

In each of the above-mentioned embodiments the photoelectric transfer element is formed on the glass substrate 1. This glass substrate 1, however, may be replaced by other insulating substrates such as an alumina substrate because it is capable of controlling the photosensitivity of the photoconductive film. Similarly, the arrangement in which the photoconductive film 3 is interposed between the top transparent electrode 4 and the bottom electrode 2 like a sandwich may be replaced by one in which an opaque electrode is used for the top transparent electrode and a transparent electrode is used for the bottom electrode.

We claim:

1. A photoelectric transfer element comprising a substrate, a bottom electrode provide don said substrate, a photoconductive film provided on said bottom electrode, and a top transparent electrode provided on said photoconductive film, wherein an electric field control electrode is provided to which is applied a voltage identical to the voltage applied to either said top transparent electrode or said bottom electrode which is used for photoelectric current detection.

2. A photoelectric transfer element as claimed in claim 1, wherein said electric field control electrode is manufactured with a forming process identical to that of said bottom electrode or said top transparent electrode.

3. A line image sensor characterized in that said photoelectric transfer element as claimed in claim 1 is linearly disposed.

4. A line image sensor characterized in that said photoelectric transfer element as claimed in claim 2 is linearly disposed.

* * * * *